(12) United States Patent
Hiwada

(10) Patent No.: US 11,919,302 B2
(45) Date of Patent: Mar. 5, 2024

(54) PRINT APPARATUS AND HEAD

(71) Applicant: BROTHER KOGYO KABUSHIKI KAISHA, Nagoya (JP)

(72) Inventor: Shuhei Hiwada, Toyoake (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 105 days.

(21) Appl. No.: 17/546,765

(22) Filed: Dec. 9, 2021

(65) Prior Publication Data

US 2022/0203680 A1    Jun. 30, 2022

(30) Foreign Application Priority Data

Dec. 28, 2020   (JP) .................. 2020-219518

(51) Int. Cl.
    *B41J 2/045*      (2006.01)
    *B41J 2/14*      (2006.01)
    *G01R 29/22*      (2006.01)

(52) U.S. Cl.
    CPC ......... *B41J 2/04581* (2013.01); *B41J 2/0455* (2013.01); *G01R 29/22* (2013.01)

(58) Field of Classification Search
    CPC .................................................. B41J 2/14233
    See application file for complete search history.

(56) References Cited

U.S. PATENT DOCUMENTS

| | | |
|---|---|---|
| 2003/0193268 A1 | 10/2003 | Junhua |
| 2004/0004413 A1 | 1/2004 | Junhua et al. |
| 2004/0108790 A1 | 6/2004 | Junhua et al. |
| 2006/0055745 A1* | 3/2006 | Yagi ...................... B41J 2/14233 347/71 |
| 2010/0277524 A1* | 11/2010 | Morita ................. B41J 2/04581 310/317 |
| 2016/0167364 A1* | 6/2016 | Matsumoto .......... B41J 2/14153 347/9 |

FOREIGN PATENT DOCUMENTS

| | | |
|---|---|---|
| JP | 2003-347622 A | 12/2003 |
| JP | 2004-96070 A | 3/2004 |

* cited by examiner

*Primary Examiner* — Shelby L Fidler

(74) *Attorney, Agent, or Firm* — KENEALY VAIDYA LLP

(57) ABSTRACT

There is provided a print apparatus including: a piezoelectric member; an individual electrode formed in the piezoelectric member; a first common electrode formed in the piezoelectric member so that the first common electrode is opposed to the individual electrode; a second common electrode formed in the piezoelectric member so that the second common electrode is opposed to the individual electrode, a voltage to be applied to the second common electrode being different from a voltage to be applied to the first common electrode; and a detection circuit configured to detect a capacitance of a first capacitor configured by the piezoelectric member, the individual electrode, and the first common electrode and a second capacitor configured by the piezoelectric member, the individual electrode, and the second common electrode. The detection circuit includes an oscillation circuit configured to be connected to the individual electrode.

14 Claims, 17 Drawing Sheets

FIG. 8
WITH WAITING TIME
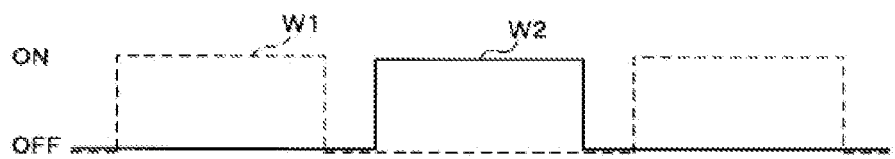
SAME TIME
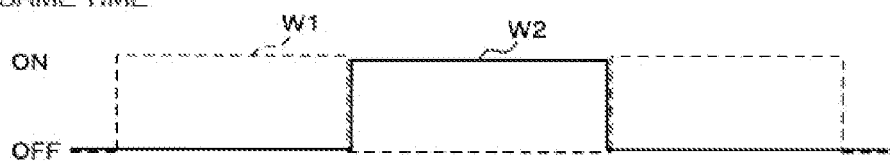
WITH OVERLAP
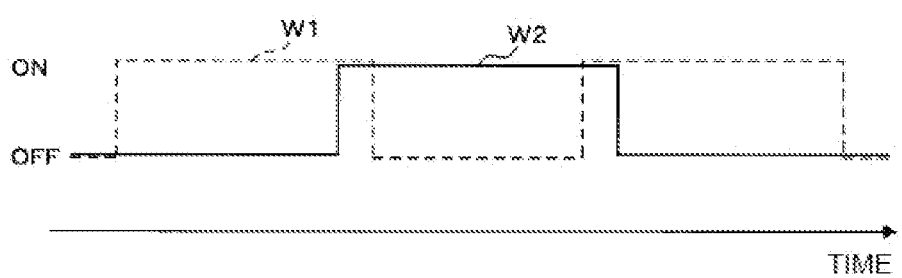
TIME

PRINT APPARATUS AND HEAD

CROSS REFERENCE TO RELATED APPLICATIONS

The present application claims priority from Japanese Patent Application No. 2020-219518, filed on Dec. 28, 2020, the disclosure of which is incorporated herein by reference in its entirety.

BACKGROUND

The present disclosure relates to a print apparatus (printing apparatus) and a head for performing printing by discharging a liquid from nozzles.

A liquid jetting head has been suggested, which is provided with an actuator including two common electrode layers, one individual electrode layer, a piezoelectric element, and a piezoelectric layer, wherein a liquid is discharged from a nozzle in accordance with the vibration of the actuator. As for the liquid discharge head, for example, the capacitance of the piezoelectric layer is measured in the inspection step.

SUMMARY

According to a first aspect of the present disclosure, there is provided a print apparatus including:
- a piezoelectric member configured to be deformed in order to discharge a liquid from a nozzle;
- an individual electrode formed in the piezoelectric member;
- a first common electrode formed in the piezoelectric member;
- a second common electrode formed in the piezoelectric member, a voltage to be applied to the second common electrode being different from a voltage to be applied to the first common electrode; and
- a detection circuit configured to detect a capacitance of a first capacitor configured by the piezoelectric member, the individual electrode, and the first common electrode and a second capacitor configured by the piezoelectric member, the individual electrode, and the second common electrode.

The detection circuit includes an oscillation circuit configured to be connected to the individual electrode.

According to a second aspect of the present disclosure, there is provided a head including:
- a piezoelectric member configured to be deformed in order to discharge a liquid from a nozzle;
- an individual electrode formed in the piezoelectric member;
- a first common electrode formed in the piezoelectric member;
- a second common electrode formed in the piezoelectric member, a voltage to be applied to the second common electrode being different from a voltage to be applied to the first common electrode; and
- a detection circuit is configured to detect a capacitance of a first capacitor configured by the piezoelectric member, the individual electrode, and the first common electrode and a second capacitor configured by the piezoelectric member, the individual electrode, and the second common electrode.

The detection circuit includes an oscillation circuit configured to be connected to the individual electrode.

BRIEF DESCRIPTION OF THE DRAWINGS

FIG. 8 is a timing chart illustrative of examples of an ON/OFF timing of a first detecting switch and an ON/OFF timing of a second detecting switch.

DETAILED DESCRIPTION

It is important for the print apparatus to measure the capacitance of the piezoelectric layer, for example, in order to estimate the temperature of the head.

The present disclosure has been made taking the foregoing circumstances into consideration, an object of which is to provide a print apparatus and a head which make it possible to measure the capacitance.

According to the print apparatus and the head of an embodiment of the present disclosure, it is possible to detect the capacitances of the first capacitor and the second capacitor by using the oscillation circuit.

First Embodiment

Figure 1:
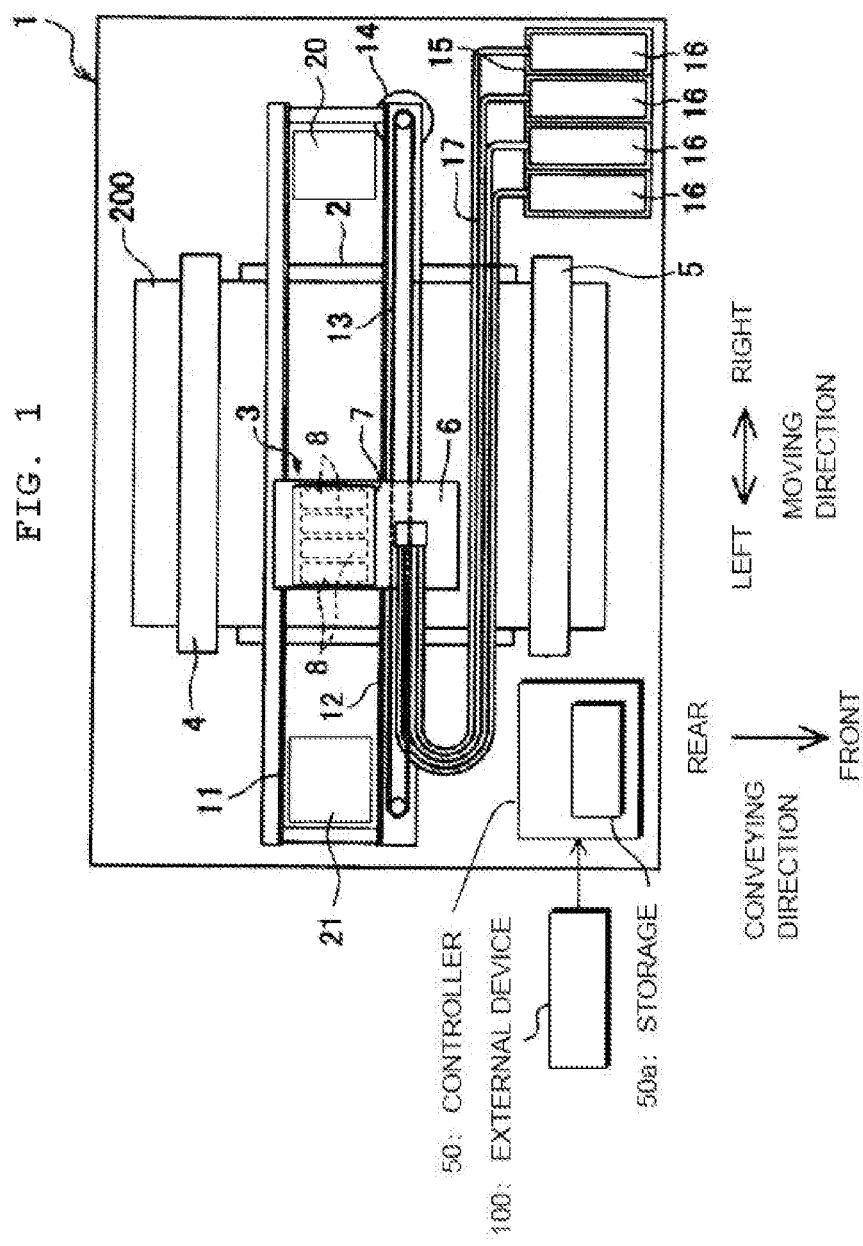
FIG. 1 is a plan view schematically illustrative of a print apparatus.
Figure 2:
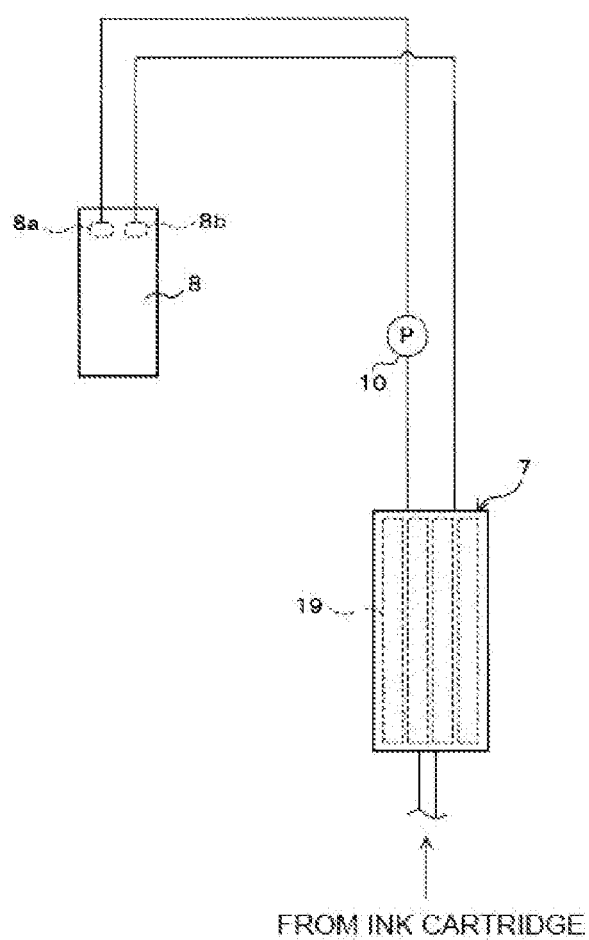
FIG. 2 is an explanatory drawing illustrative of the flow of an ink between a subtank and an ink-jet head.

A print apparatus according to a first embodiment of the present disclosure will be explained below on the basis of the drawings. FIG. 1 is a plan view schematically illustrative of the print apparatus, and FIG. 2 is an explanatory drawing illustrative of the flow of an ink between a subtank and an ink jet head. In the following description, the front-rear (back) direction and the left-right direction shown in FIG. 1 are used. The front-rear direction corresponds to the conveying direction, and the left-right direction corresponds to the moving direction. Further, the front side of the paper surface of FIG. 1 corresponds to the upper side, and the back side of the paper surface of FIG. 1 corresponds to the lower side. In the following description, the upward-downward direction shown in FIG. 1 (direction orthogonal to the paper surface of FIG. 1) is also used.

As depicted in FIG. 1, the print apparatus 1 is provided with, for example, a platen 2, an ink discharge device 3, and conveying rollers 4, 5. Recording paper 200 as a recording medium is placed on the upper surface of the platen 2. The ink discharge device 3 discharges inks to the recording paper 200 placed on the platen 2 so that an image is recorded. The ink discharge device 3 is provided with, for example, a carriage 6, a subtank 7, four ink-jet heads 8, and a circulation pump 10 (FIG. 2).

Two guide rails 11, 12, which extend leftwardly and rightwardly to guide the carriage 6, are provided on the upper side of the platen 2. An endless belt 13, which extends leftwardly and rightwardly, is connected to the carriage 6. The endless belt 13 is driven by a carriage driving motor 14. In accordance with the driving of the endless belt 13, the carriage 6 is reciprocatively moved in the moving direction in the area opposed to the platen 2, while being guided by the guide rails 11, 12. More specifically, the carriage 6 performs the first movement in which the head is moved from a certain position to another position from the left to the right in the moving direction and the second movement in which the head is moved from the another position to the certain position from the right to the left in the moving direction in a state in which the carriage 6 supports the four ink-jet heads 8.

A cap 20 and a flashing receiver 21 are provided between the guide rails 11, 12. The cap 20 and the flashing receiver 21 are arranged on the lower side as compared with the ink discharge device 3. The cap 20 is arranged at the right end portions of the guide rails 11, 12, and the flashing receiver 21 is arranged at the left end portions of the guide rails 11, 12. Note that the position of the cap 20 and the position of the flashing receiver 21 may be opposite to one another.

The subtank 7 and the four ink-jet heads 8 are carried on the carriage 6, and they are reciprocatively movable in the moving direction together with the carriage 6. The subtank 7 is connected to a cartridge holder 15 via tubes 17. An ink cartridge 16 or ink cartridges 16 for one color or a plurality of colors (four colors in this embodiment) is/are installed to the cartridge holder 15. The four colors are exemplified, for example, by black, yellow, cyan, and magenta.

Four ink chambers 19 (FIG. 2) are formed at the inside of the subtank 7. The four color inks, which are supplied from the four ink cartridges 16, are stored in the four ink chambers 19 respectively.

The four ink-jet heads 8 are aligned in the moving direction on the lower side of the subtank 7. A plurality of nozzles 80 (FIG. 3) are formed on the lower surface of each of the ink jet heads 8. As depicted in FIG. 2, one ink jet head 8 corresponds to the ink of one color, and one ink-jet head 8 is connected to one ink chamber 19. That is, the four ink-jet heads 8 correspond to the inks of four colors respectively, and the four ink-jet heads 8 are connected to the four ink chambers 19 respectively.

An ink supply port 8*a* and an ink discharge port 8*b* are provided on the upper surface of the ink-jet head 8. The ink supply port 8*a* and the ink discharge port 8*b* are connected to the ink chamber 19, for example, via tubes. A circulating pump 10 is installed between the ink supply port 8*a* and the ink chamber 19.

The circulating pump 10 is, for example, a tube pump for extruding the liquid contained in a tube by rolling (rubbing, stroking,) the tube with a rotor. The circulating pump 10 feeds the ink contained in the ink chamber 19 into the ink jet head 8.

The ink, which is fed from the ink chamber 19 by the circulating pump 10, passes through the ink supply port 8*a*, and the ink flows into the ink jet head 8. The ink is discharged from the nozzles 80. The ink, which is not discharged from the nozzles 80, passes through the ink discharge port 8*b*, and the ink returns to the ink chamber 19.

The ink circulates between the ink chamber 19 and the ink-jet head 8. Note that it is also allowable to use another power source for the circulation, for example, a device which feeds the compressed air into the subtank 7 and which feeds the ink into the ink-jet head 8, in place of the circulating pump 10. The four ink-jet heads 8 discharge the four color inks supplied from the subtank 7 to the recording paper 200, while moving in the moving direction together with the carriage 6.

As depicted in FIG. 1, the conveying roller 4 is arranged on the upstream side (rear side) in the conveying direction from the platen 2. The conveying roller 5 is arranged on the downstream side (front side) in the conveying direction from the platen 2. The two conveying rollers 4, 5 are synchronously driven by a motor (not depicted). The two conveying rollers 4, 5 convey the recording paper 200 placed on the platen 2, in the conveying direction orthogonal to the moving direction. The print apparatus 1 is provided with a controller 50. The controller 50 is provided with, for example, CPU or a logic circuit (for example, FPGA), a nonvolatile memory, and a storage (storage unit) 50*a* such as RAM or the like. The controller 50 receives the printing job from the external device (external apparatus) 100, and the controller 50 stores the printing job in the storage 50*a*. The controller 50 controls the driving of, for example, the ink discharge device 3 and the conveying roller 4 on the basis of the printing job, and the controller 50 executes the printing process.

Figure 3:
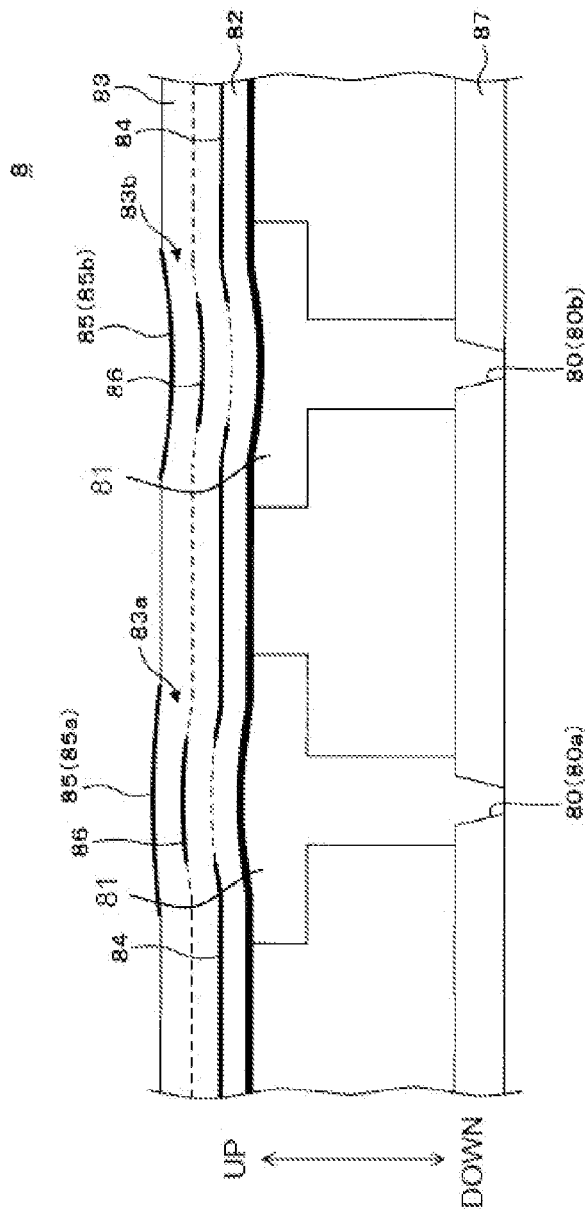
FIG. 3 is a partial enlarged sectional view schematically illustrative of the ink-jet head.

FIG. 3 is a partial enlarged sectional view schematically illustrative of the ink-jet head 8. The ink-jet head 8 is provided with a plurality of pressure chambers 81. The plurality of pressure chambers 81 constitute a plurality of pressure chamber arrays. A vibration plate 82 is formed on the upper side of the pressure chambers 81. A layered piezoelectric member 83 is formed on the upper side of the vibration plate 82. A first common electrode 84 is formed between the piezoelectric member 83 and the vibration plate 82 on the upper side of each of the pressure chambers 81.

A second common electrode 86 is provided at the inside of the piezoelectric member 83. The second common electrode 86 is arranged on the upper side of each of the pressure chambers 81 and on the upper side as compared with the first common electrode 84. The second common electrode 86 is arranged at the position at which the second common electrode 86 is not opposed to the first common electrode 84. An individual electrode 85 is formed on the upper surface of the piezoelectric member 83 on the upper side of each of the pressure chambers 81. The individual electrode 85 is vertically opposed to the first common electrode 84 and the second common electrode 86 with the piezoelectric member 83 intervening therebetween. In other words, the ink-jet head 8 includes the piezoelectric member 83, the individual electrode 85, the first common electrode 84, and the second common electrode 86. Note that the ink-jet head 8 also includes a detection circuit 65 described later on.

A nozzle plate 87 is provided under or below each of the pressure chambers 81. A plurality of nozzles 80, which penetrates vertically, are formed through the nozzle plate 87. Each of the nozzles 80 is arranged on the lower side of each of the pressure chambers 81. The plurality of nozzles 80 constitute a plurality of nozzle arrays which extend along with the pressure chamber arrays.

The plurality of nozzles 80 include first nozzles 80*a* and second nozzles 80*b*. The portion of the piezoelectric member 83, which is arranged on the upper side of the first nozzle 80*a*, is also referred to as "first piezoelectric member 83*a*", and the individual electrode 85, which is formed in the first piezoelectric member 83a, is also referred to as "first individual electrode 85a". The portion of the piezoelectric member 83, which is arranged on the upper side of the second nozzle 80b, is also referred to as "second piezoelectric member 83b", and the individual electrode 85, which is formed in the second piezoelectric member 83b, is also referred to as "second individual electrode 85b".

The first common electrode 84 is connected to a COM terminal, i.e., the ground in this embodiment. The second common electrode 86 is connected to a VCOM terminal. The output voltage of the VCOM voltage is higher than the output voltage of the COM voltage. The individual electrode 85 is connected to a switch control unit 67 (see FIG. 4). The High voltage or the Low voltage is applied to the individual electrode 85, the piezoelectric member 83 is deformed, and the vibration plate 82 is vibrated. The ink is discharged from the pressure chamber 81 via the nozzle 80 in accordance with the vibration of the vibration plate 82.

Figure 4:
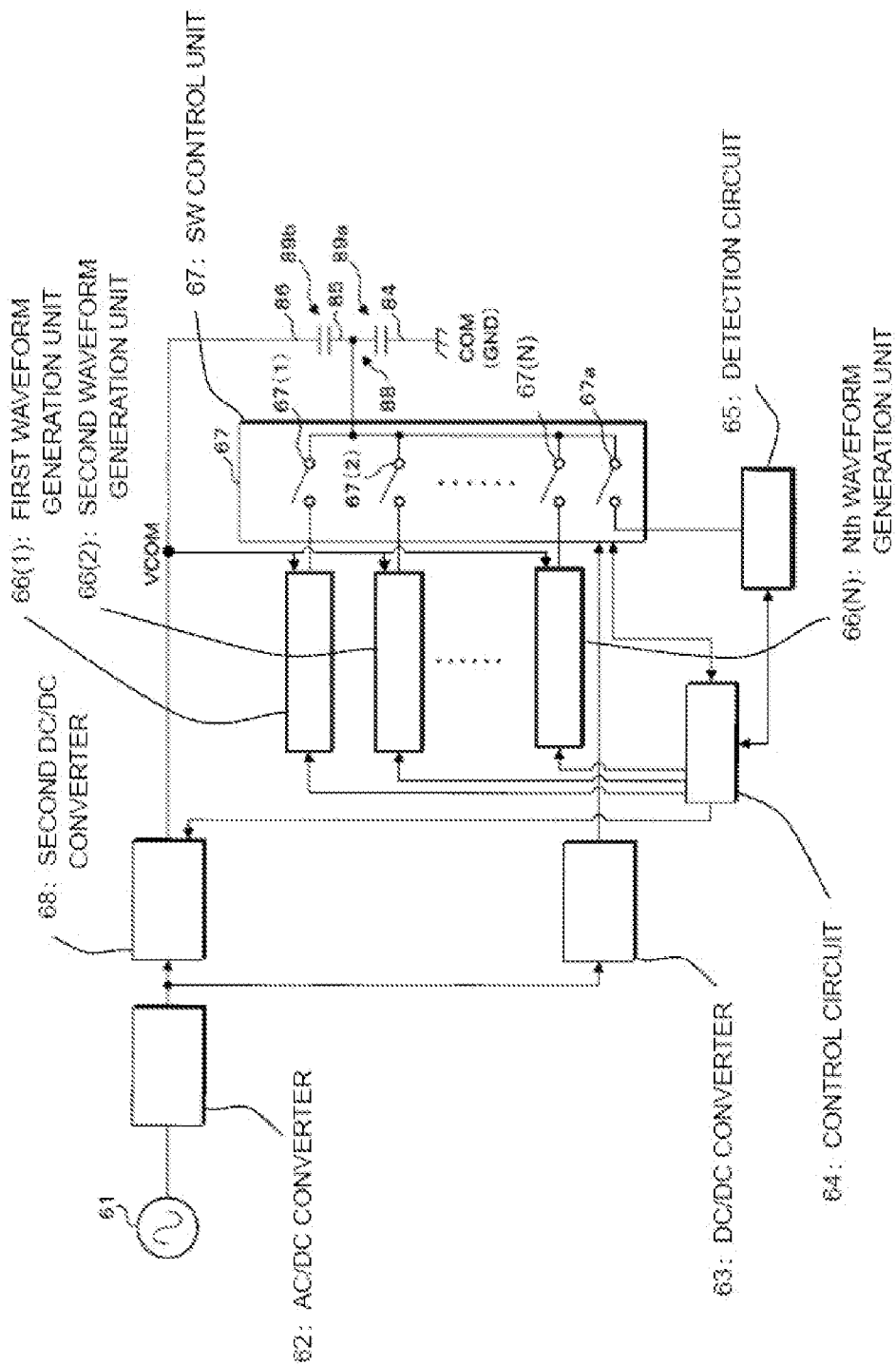
FIG. 4 is a block diagram of the print apparatus.

FIG. 4 is a block diagram of the print apparatus 1. The print apparatus 1 is provided with an AC/DC converter 62 connected to an AC power source 61. The AC/DC converter 62 converts the AC voltage to the DC voltage which is outputted to a DC/DC converter 63. The DC/DC converter 63 changes the voltage, and the changed voltage is outputted to the switch control unit (SW control unit) 67.

The switch control unit 67 is provided with a plurality of nth switches 67(n) (n=1, 2, ..., N) and a detecting switch 67a. The switch control unit 67 constitutes a switching circuit. The plurality of nth switches 67(n) and the detecting switch 67a are configured, for example, by an analog switch IC. One end of each of the plurality of nth switches 67(n) and one end of the detecting switch 67a are connected to the individual electrode 85 via a common bus.

The respective other ends of the plurality of nth switches 67(n) are connected to a plurality of nth waveform generating units 66(n) (n=1, 2, ..., N) respectively. That is, the first switch 67(1) is connected to the first waveform generation unit 66(1), the second switch 67(2) is connected to the second waveform generation unit 66(2), and the Nth switch 67(N) is connected to the Nth waveform generation unit 66(N).

The AC/DC converter 62 converts the AC voltage to the DC voltage which is outputted to a second DC/DC converter 68. The second DC/DC converter 68 outputs the VCOM voltage to each of the plurality of nth waveform generating units 66(n), and the second DC/DC converter 68 outputs the VCOM voltage to the second common electrode 86.

A first capacitor 89a is configured by the individual electrode 85, the first common electrode 84, and the piezoelectric member 83. A second capacitor 89b is configured by the individual electrode 85, the second common electrode 86, and the piezoelectric member 83.

Figure 5:
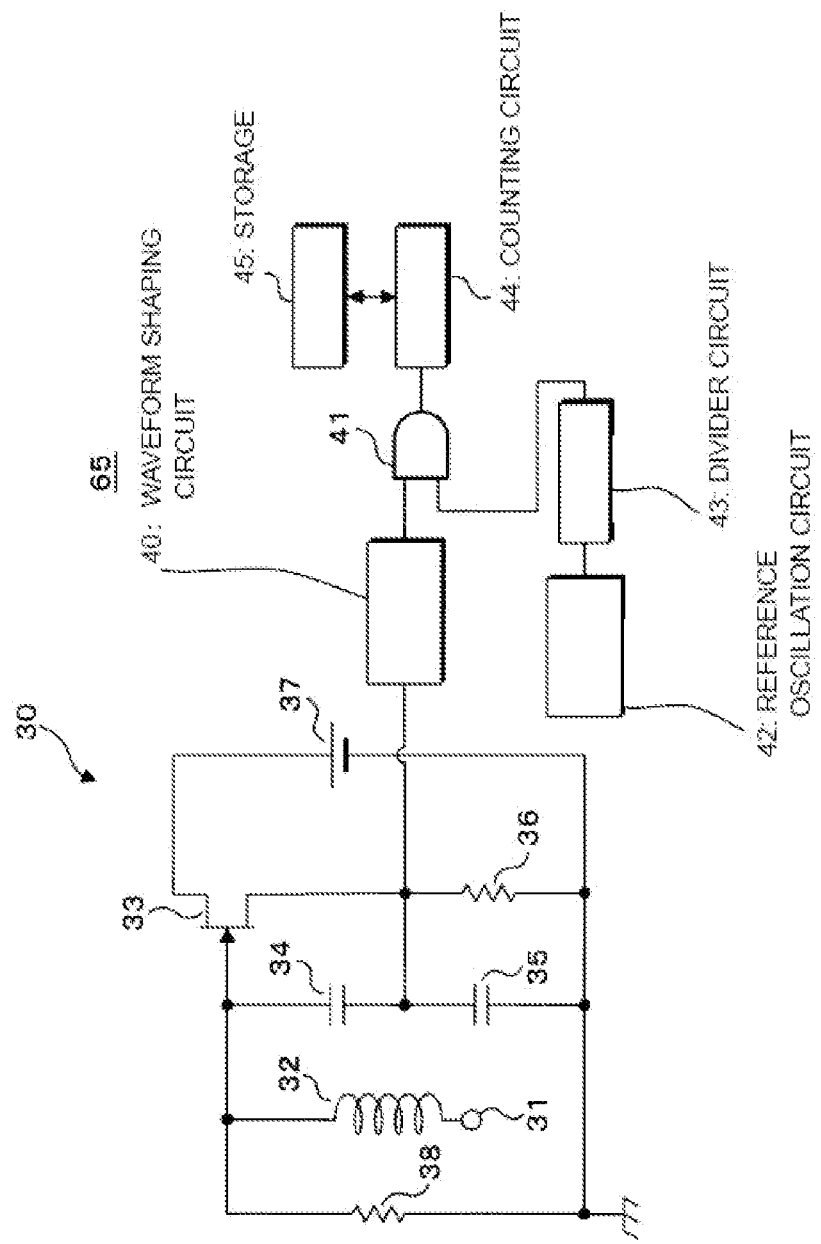
FIG. 5 is a circuit diagram of a detection circuit.

The other end of the detecting switch 67a is connected to a terminal 31 of the detection circuit 65 (see FIG. 5). The detection circuit 65 detects the capacitance of the actuator 88, in other words, the capacitance of (in relation to) the first capacitor 89a and the second capacitor 89b. The print apparatus 1 is provided with the control circuit 64. The control circuit 64 is provided with, for example, CPU, a nonvolatile memory, RAM, or a logic circuit (for example, FPGA). The control circuit 64 allows the switch control unit 67 to connect (turn on) or disconnect (turn off) the plurality of nth switches 67(n) and the detecting switch 67a. The control circuit 64 allows each of the plurality of nth waveform generating units 66(n) to output the driving waveform. The plurality of nth waveform generating units 66(n) output the mutually different waveforms respectively. The control circuit 64 allows the detection circuit 65 to detect the capacitance of the actuator 88. The control circuit 64 instructs the second DC/DC converter 68 in relation to the voltage value. The second DC/DC converter 68 outputs the voltage corresponding to the instructed voltage value.

An explanation will be made about a case in which the actuator 88 is driven. For example, when the actuator 88 is driven in accordance with the driving waveform generated by the first waveform generation unit 66(1), the control circuit 64 allows the switch control unit 67 to connect (turn on) only the first switch 67(1) so that the driving waveform is outputted from the first waveform generation unit 66(1) to the actuator 88. In this situation, all of the other switches, i.e., the second switch 67(2), the third switch 67(3), ... the Nth switch 67(N), and the detecting switch 67a are disconnected (turned off). Note that the process is also executed in the same manner as described above when the actuator 88 is driven by the driving waveform generated by the second waveform generation unit 66(2), the third waveform generation unit 66(3), ..., or the Nth waveform generation unit 66(N).

An explanation will be made about the circuit operation to detect the capacitance of the actuator 88. The control circuit 64 allows the switch control unit 67 to connect (turn on) only the detecting switch 67a. The detection circuit 65 performs the charge and the discharge, for example, with respect to the first capacitor 89a and the second capacitor 89b so that the capacitance of the actuator 88 is measured. In this situation, all of the plurality of nth switches 67(n), i.e., the first switch 67(1), the second switch 67(2), ..., and the Nth switch 67(N) are disconnected (turned off).

FIG. 5 is a circuit diagram of the detection circuit 65. The detection circuit 65 is provided with a clap type oscillation circuit 30. The clap type oscillation circuit 30 is provided with an inductor 32. One end of the inductor 32 is connected to a terminal 31. The terminal 31 is connected to the other end of the detecting switch 67a. The other end of the inductor 32 is connected to the gate of FET 33. The drain of FET 33 is connected to the cathode of a power source 37. The source of FET 33 is connected to the ground via a resistor 36. The anode of the power source 37 is connected to the ground. Note that FET 33 has the switching function. It is also allowable to use an element having the switching function, for example, a bipolar transistor in place of FET.

The clap type oscillation circuit 30 is provided with two capacitors 34, 35. The two capacitors 34, 35 are connected in series. One capacitor 34 is connected to the gate of FET 33. The other capacitor 35 is connected to the ground. The clap type oscillation circuit 30 is provided with a resister 38. One end of the resister 38 is connected to the gate of FET 33, and the other end of the resister 38 is connected to the ground. A waveform signal is outputted from the connection point among FET 33, the resistor 36, and the capacitors 34, 35.

The detection circuit 65 is provided with a waveform shaping circuit 40, an AND gate 41, a reference oscillation circuit 42, a divider circuit (frequency division circuit) 43, a counting circuit 44, and a storage (storage unit) 45. The waveform shaping circuit 40, the AND gate 41, the reference oscillation circuit 42, the divider circuit 43, and the counting circuit 44 constitute a frequency counter based on the direct count system. The waveform shaping circuit 40 is connected to the output of the clap type oscillation circuit 30. The waveform signal is inputted into the waveform shaping circuit 40.

The waveform shaping circuit 40 shapes the inputted waveform signal, and the signal is outputted to the AND gate 41. For example, a rectangular pulse wave is formed and outputted. The reference oscillation circuit 42 generates a clock signal which is outputted to the divider circuit 43. The divider circuit 43 divides the inputted clock signal (performs frequency division for the inputted clock signal) and outputs the signal to the AND gate 41. For example, the time of High of the divided clock signal is the measuring time. The pulse wave, which is inputted from the waveform shaping circuit 40 during the measuring time, is outputted to the counting circuit 44 by the AND gate 41. The counting circuit 44 counts the pulse number of the inputted pulse wave, and the number of pulse waves is divided by the measuring time to derive the frequency F1 of the waveform signal outputted from the clap type oscillation circuit 30. For example, if the number of pulses inputted into the counting circuit 44 is 10000, and the measuring time is 1 ms, then the frequency of 10000/0.001=10 MHz is derived. Then the combined capacitance C3 of the first capacitor 89$a$ and the second capacitor 89$b$ is derived on the basis of Numerical Expression 1 shown below. Note that in Numerical Expression 1 shown below, C1 represents the capacitance of the capacitor 34, C2 represents the capacitance of the capacitor 35, C3 represents the combined capacitance of the first capacitor 89$a$ and the second capacitor 89$b$, and L1 represents the inductance of the inductor 32.

$$F1 = \frac{1}{2\pi\sqrt{L_1\left(\frac{C_1 C_2 C_3}{C_2 C_3 + C_1 C_3 + C_1 C_2}\right)}} \quad (1)$$

The storage unit 45 stores the reference frequency F0 of the waveform signal supplied from the first capacitor 89$a$ and the second capacitor 89$b$ and the reference combined capacitance C0 of the first capacitor 89$a$ and the second capacitor 89$b$, while allowing them to correspond to one another. The counting circuit 44 calculates the difference between the frequency F1 and the reference frequency F0. The counting circuit 44 calculates the difference C3−C0 between the combined capacitance C3 of the first capacitor 89$a$ and the second capacitor 89$b$ and the reference combined capacitance C0, from the difference between the frequencies F1−F0, by using for example the Numerical Expression 1, and then obtain the combined capacitance C3 by adding the difference C3−C0 to the reference combined capacitance C0.

The difference between the frequencies F1−F0 corresponds to the difference between the capacitances C3−C0, and the temperature change amount of the actuator 88 corresponds to the difference between the capacitances C3−C0. That is, the difference between the frequencies F1−F0 corresponds to the temperature change amount of the actuator 88. Therefore, it is possible to determine the temperature change amount of the actuator 88 from the difference between the frequencies F1−F0.

Figure 6A:
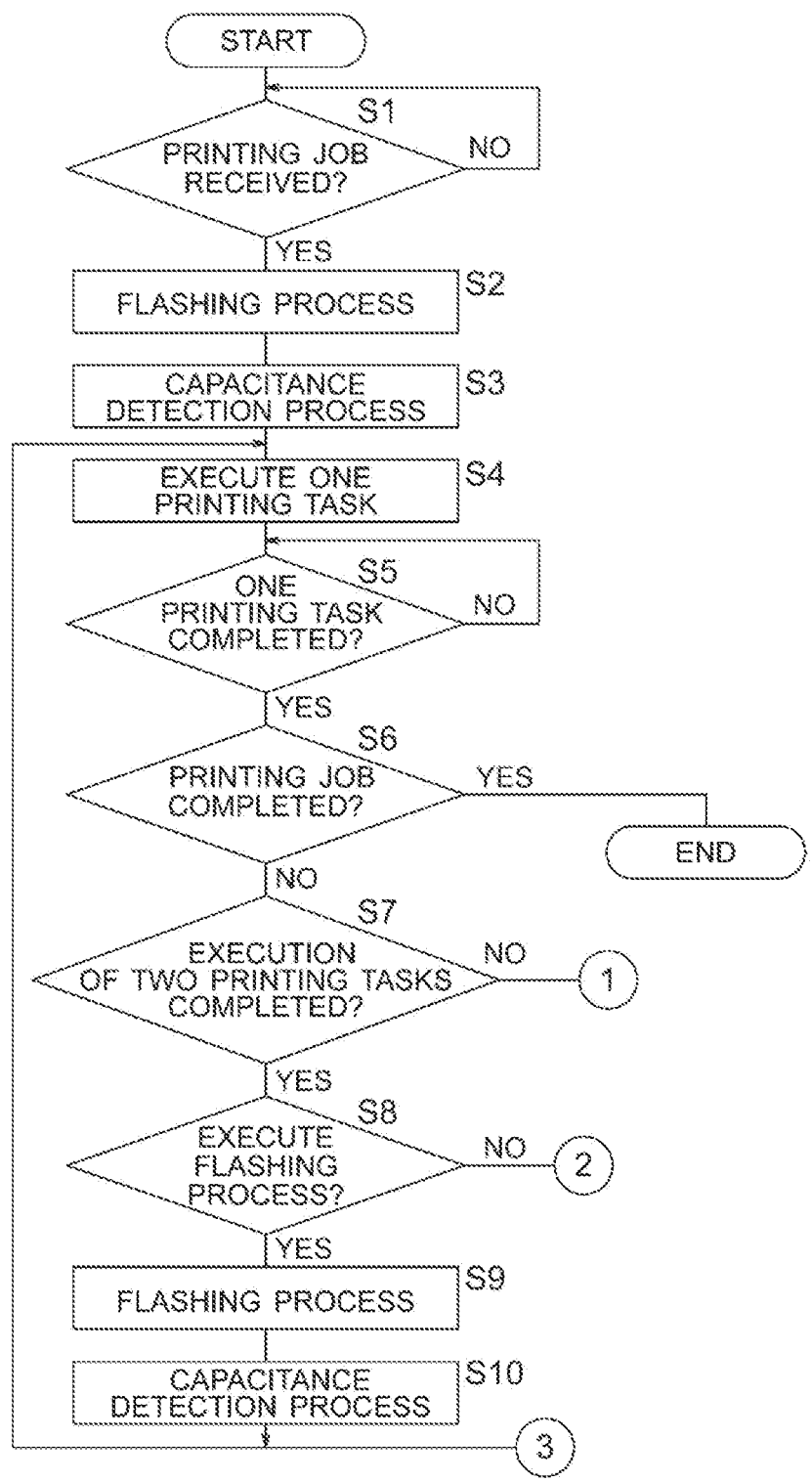
FIGS. 6A and 6B are flow charts illustrative of a printing process controlled by a controller.
Figure 6B:
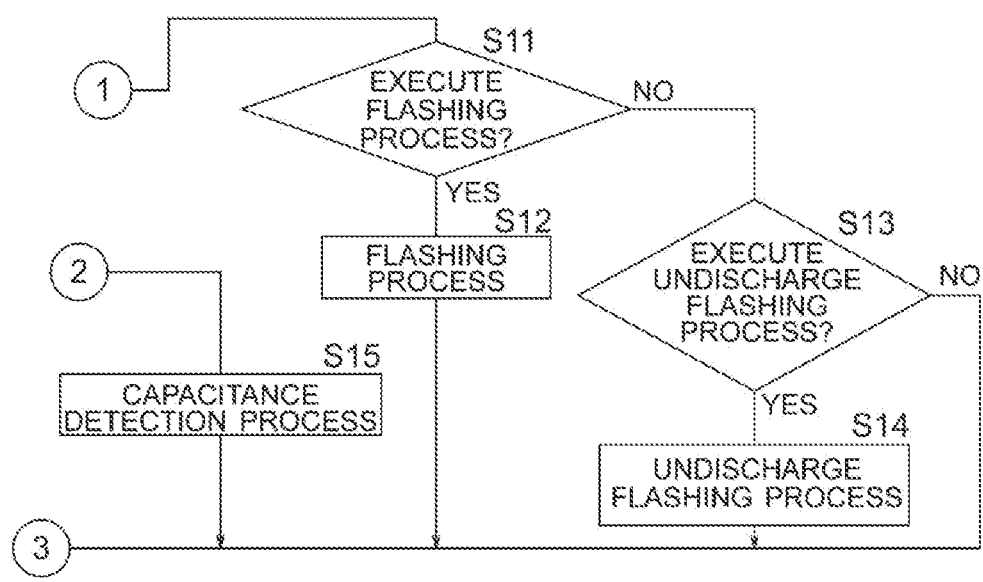

FIG. 6 is a flow chart illustrative of a printing process controlled by the controller 50. The controller 50 determines whether or not any printing job is received from the external device 100 (S1). If (in a case that) the printing job is not received (S1: NO), the controller 50 returns the process to Step S1. If the printing job is received (S1: YES), the controller 50 executes the flashing process (S2). The flashing process is the process for discharging the ink from the nozzles 80 for the purpose other than the printing.

Subsequently, the controller 50 executes a capacitance detection process (S3). The capacitance detection process is periodically executed, for example, in order to detect the temperature of the ink jet head 8. The controller 50 outputs a detection execution command to the control circuit 64. The control circuit 64 allows the detection circuit 65 to detect the capacitances of the first capacitor 89$a$ and the second capacitor 89$b$. Subsequently, the controller 50 executes one printing task (S4). The printing task is the unit or component for constructing (configuring) the printing job. Specifically, the printing task resides in (or includes) the liquid discharge process to be performed during the period in which the ink jet head 8 is moved rightwardly or leftwardly in an amount corresponding to the left-right width of the recording paper 200. Subsequently, the controller 50 determines whether or not one printing task is completed (S5). Note that the carriage 6 performs the moving once in one printing task. If one printing task is not completed (S5: NO), the process is returned to Step S5. If one printing task is completed (S5: YES), the controller 50 determines whether or not the printing job is completed (S6).

If the printing job is completed (S6: YES), the controller 50 terminates the printing process. If the printing job is not completed (S6: NO), the controller 50 determines whether or not two printing tasks are completed (S7). If two printing tasks are completed (S7: YES), the controller 50 determines whether or not the timing is the timing at which the flashing process is to be performed (S8). The flashing process is periodically executed for the maintenance for the nozzles 80. If the timing is the timing at which the flashing process is to be performed (S8: YES), the controller 50 executes the flashing process (S9). The controller 50 executes the capacitance detection process (S10), and the process is returned to Step S4. Note that it is also allowable that the controller 50 determines whether or not one printing task is completed in Step S7. Further, the flashing process may be executed after executing the capacitance detection process.

In Step S8, if the timing is not the timing at which the flashing process is to be performed (S8: NO), then the controller 50 executes the capacitance detection process (S15), and the process is returned to Step S4.

In Step S7, if two printing tasks are not completed (S7: NO), the controller 50 determines whether or not the timing is the timing at which the flashing process is to be performed (S11). If the timing is the timing at which the flashing process is to be performed (S11: YES), then the controller 50 executes the flashing process (S12), and the process is returned to Step S4.

In Step S11, if the timing is not the timing at which the flashing process is to be performed (S11: NO), the controller 50 determines whether or not the timing is the timing at which the undischarge flashing process is to be executed (S13). The undischarge flashing process is the process to be performed in order to prevent the nozzles 80 from being dried, without discharging the liquid. In particular, the piezoelectric member 83 is slightly deformed to swing the surface (meniscus) of the liquid in this process. The undischarge flashing process is periodically executed. If the timing is the timing at which the undischarge flashing process is to be executed (S13: YES), then the controller 50 executes the undischarge flashing process (S14), and the process is returned to Step S4. In Step S14, the controller 50 outputs a command to execute the undischarge flashing process to the control circuit 64. The control circuit 64 allows one of the plurality of nth waveform generating units 66($n$) to generate the driving waveform corresponding to the undischarge flashing process, and the driving waveform is supplied to the individual electrode 85. If the timing is not the timing at which the undischarge flashing process is to be executed (S13: NO), the controller 50 returns the process to Step S4.

In Steps S10 and S15, the detecting switch 67a is connected and the capacitance detection process is executed in the state in which the voltage is applied to the first common electrode 84 (COM) and the second common electrode 86 (VCOM), i.e., in the hot-line state in accordance with the execution of the flashing process or the printing task. If the detecting switch 67a is connected in the hot-line state, the voltage, which is divided by the first capacitor 89a and the second capacitor 89b, is inputted into the clap type oscillation circuit 30. The parallel resistance value of the first capacitor 89a and the second capacitor 89b is sufficiently large. On this account, even when the detecting switch 67a is connected in the hot-line state, then the clap type oscillation circuit 30 is not destroyed, and it is possible to execute the capacitance detection process.

In order to prevent the detection circuit 65 from being destroyed, in some cases, the voltage of VCOM is turned ON, then the voltage of VCOM is turned OFF, and it is waited until the voltage of VCOM is stabilized, before the detecting switch 67a is connected (turned on). However, the time, which is required for the capacitance detection process, is prolonged on account of the waiting time. As described above, in the first embodiment, the controller 50 can perform the capacitance detection process in the hot-line state, for example, during the printing. Therefore, it is possible to shorten the detection time for the capacitance.

In the first embodiment, the oscillation circuit, for example, the clap type oscillation circuit 30 is used for the detection circuit 65. Thus, it is possible to detect the capacitances of the first capacitor 89a and the second capacitor 89b.

Further, the oscillation circuit is connected to the individual electrode 85 in the state in which the voltage is applied between the first common electrode 84 and the second common electrode 86, for example, during the printing so that the capacitances of the first capacitor 89a and the second capacitor 89b are detected. It is unnecessary to wait until the voltage is stabilized after turning ON and OFF the voltage application to the second common electrode 86. Thus, it is possible to shorten the time for the detection of the capacitance.

Further, the frequency is measured every time when the carriage 6 performs one moving or two movings a predetermined number of times. Thus, it is possible to reduce the number of times of the capacitance detection process.

Second Embodiment

Figure 7:
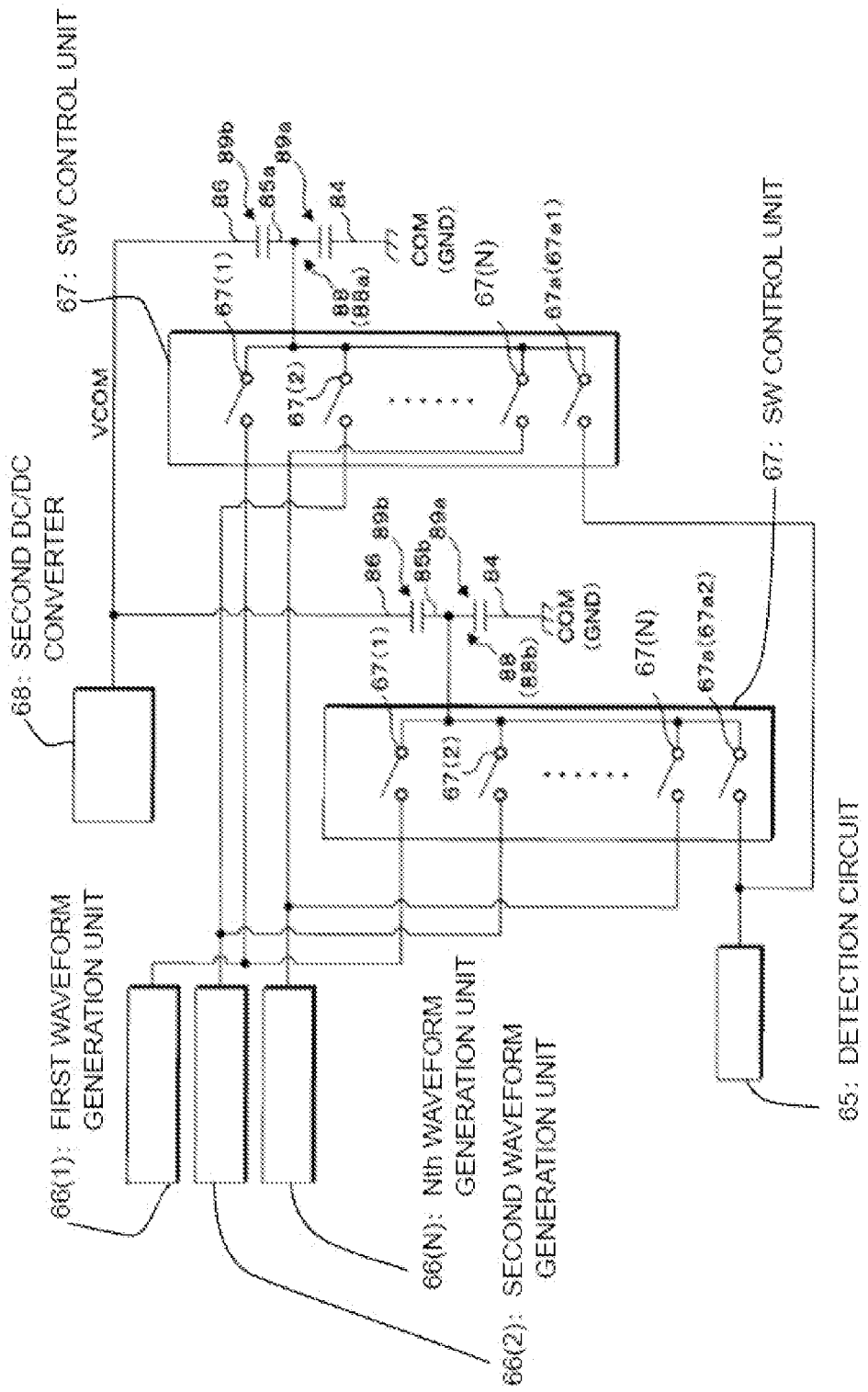
FIG. 7 is a block diagram of a controller.

A print apparatus 1 according to a second embodiment of the present disclosure will be explained below on the basis of the drawing. The components or parts concerning the second embodiment, which are the same as or equivalent to those of the first embodiment, are designated by the same reference numerals, any detailed explanation of which will be omitted. FIG. 7 is a block diagram of a controller 50. Note that in FIG. 7, the AC power source 61 and the DC/DC converter 63 are omitted from the illustration.

The controller 50 is provided with a plurality of actuators 88 including a first actuator 88a and a second actuator 88b. Switch control units 67 are provided for the first actuator 88a and the second actuator 88b respectively. A plurality of nth waveform generating units 66(n) are connected to a plurality of nth switches 67(n) of the two switch control units 67 respectively. That is, one nth waveform generating unit 66(n) is connected to the plurality of corresponding nth switches 67(n). A detection circuit 65 is connected to a detecting switch 67a of each of the switch control units 67. That is, one detection circuit 65 is connected to the plurality of detecting switches 67a. In this case, the detecting switch 67a, which is connected to the first actuator 88a, is designated as "first detecting switch 67a1", and the detecting switch 67a, which is connected to the second actuator 88b, is designated as "second detecting switch 67a2".

For example, when the capacitances of the first actuator 88a and the second actuator 88b are detected, then the first detecting switch 67a1 is firstly connected (turned on), and the second detecting switch 67a2 is disconnected (turned off) so that the capacitance of the first actuator is detected. Subsequently, the first detecting switch 67a1 is disconnected (turned off), and the second detecting switch 67a2 is connected (turned on) so that the capacitance of the second actuator is detected. Note that the respective capacitances of the first actuator 88a and the second actuator 88b are detected in the state in which the voltage is applied between the first common electrode 84 and the second common electrode 86 in the same manner as the first embodiment.

FIG. 8 is a timing chart illustrative of examples of an ON/OFF timing of the first detecting switch 67a1 and an ON/OFF timing of the second detecting switch 67a2. With reference to FIG. 8, W1 indicates the ON/OFF timing of the first detecting switch 67a1, and W2 indicates the ON/OFF timing of the second detecting switch 67a2. ON means the connection of the switch, and OFF means the disconnection of the switch.

As depicted in FIG. 8, in the case of "with waiting time", the waiting time exists until the second detecting switch 67a2 is turned ON after the first detection signal 67a1 is turned OFF. The waiting time exists until the first detecting switch 67a1 is turned ON after the second detection signal 67a2 is turned OFF.

In the case of "same time", the first detecting switch 67a1 and the second detecting switch 67a2 are turned ON/OFF at the same time (simultaneously).

In the case of "with overlap", the second detecting switch 67a2 is turned ON in a state in which the first detecting switch 67a1 is turned ON. After a predetermined time elapses, the first detecting switch 67a1 is turned OFF. The first detecting switch 67a1 is turned ON in a state in which the second detecting switch 67a2 is turned ON. After a predetermined time elapses, the second detecting switch 67a2 is turned OFF. That is, when the ON/OFF states of the first detecting switch 67a1 and the second detecting switch 67a2 are switched, there is a time in which both of the first detecting switch 67a1 and the second detecting switch 67a2 are turned ON.

Figure 9:
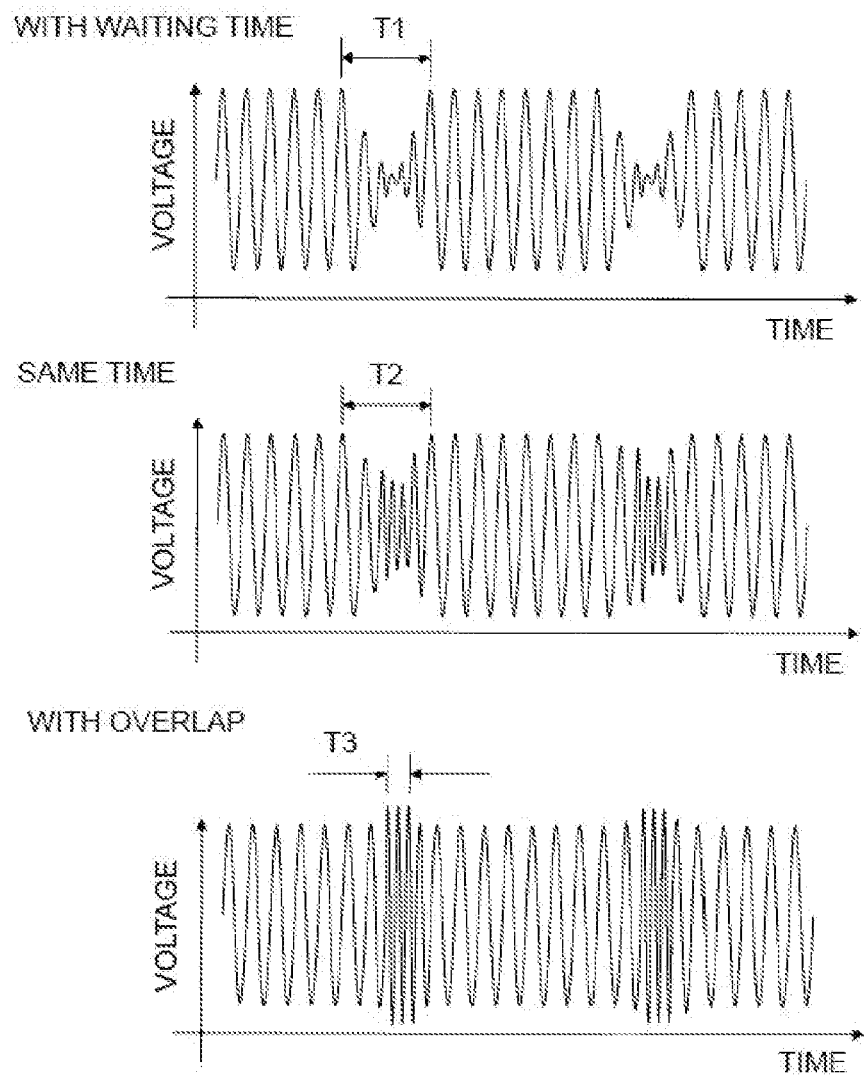
FIG. 9 is a timing chart illustrative of examples of a voltage waveform from a first capacitor of a first actuator and a voltage waveform from a second capacitor of a second actuator, inputted into a detection circuit.

FIG. 9 is a timing chart illustrative of examples of voltage waveforms from the first capacitor 89a and the second capacitor 89b, of the first actuator 88a and the second actuator 88b inputted into the detection circuit 65. With reference to FIG. 9, "with waiting time", "same time", and "with overlap" correspond to "with waiting time", "same time", and "with overlap" shown in FIG. 8 respectively.

In the case of "with waiting time", the voltage waveform from the first capacitor 89a and the second capacitor 89b, which is inputted into the detection circuit 65, is unstable during a period of time T1 in the waiting time. In the case of "same time", the voltage waveform is unstable during a period of time T2. In the case of "with overlap", if ON/OFF is switched for the first detecting switch 67a1 and the second detecting switch 67a2, the voltage waveform is unstable during a period of time T3. However, the time T3 is merely a time corresponding to several waves, which is shorter than the times T1 and T2.

In the second embodiment, when the ON/OFF is switched for the first detecting switch 67a1 and the second detecting switch 67a2, then the time, in which both of the first detecting switch 67a1 and the second detecting switch 67a2 are turned ON, is provided, and the voltage waveform from the first capacitor 89a and the second capacitor 89b, which is inputted into the detection circuit 65, is stabilized in a short period of time.

Third Embodiment

Figure 10:
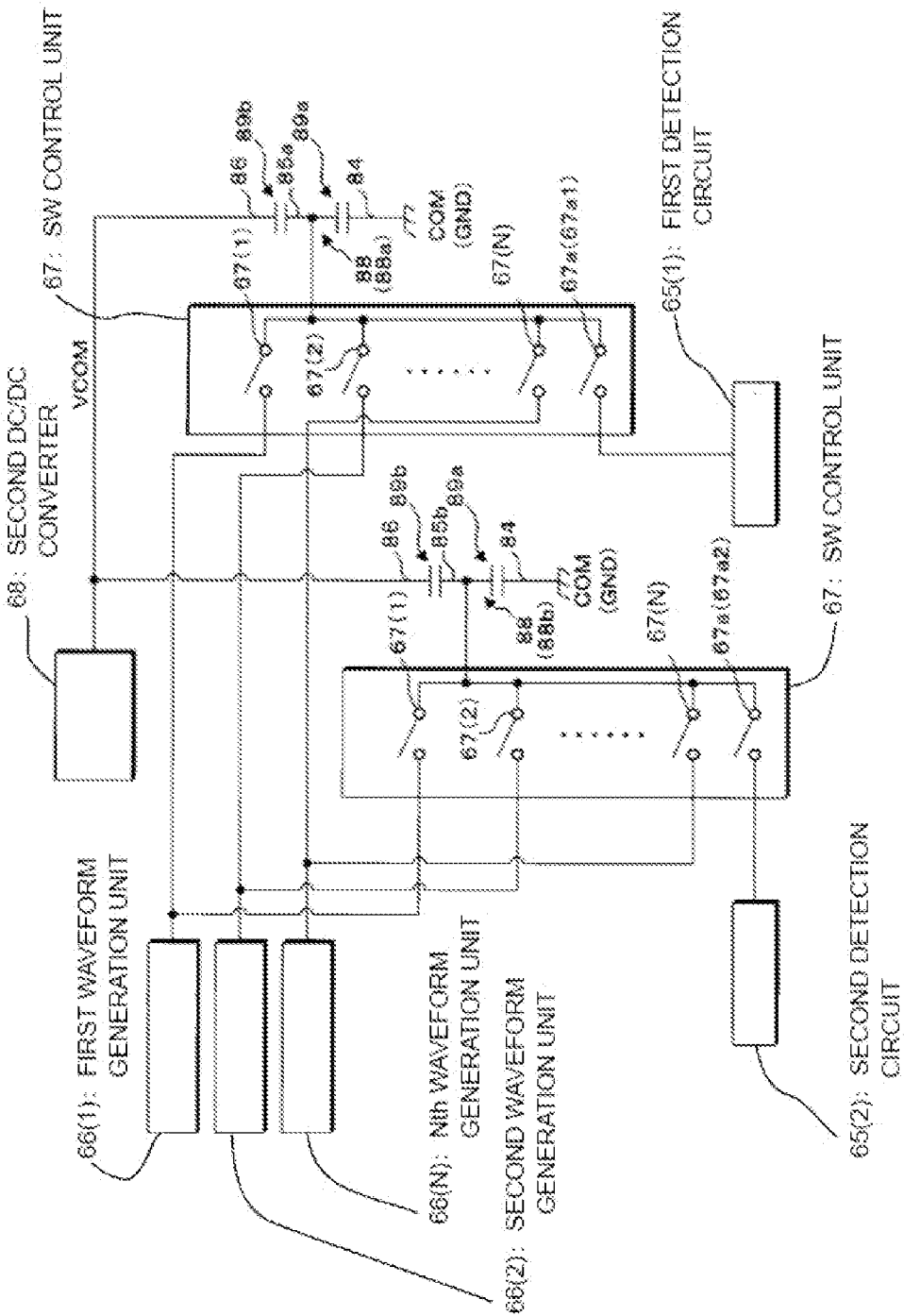
FIG. 10 is a block diagram of a controller.

A print apparatus 1 according to a third embodiment of the present disclosure will be explained below on the basis of the drawing. The components or parts concerning the third embodiment, which are the same as or equivalent to those of the first or second embodiment, are designated by the same reference numerals, any detailed explanation of which will be omitted. FIG. 10 is a block diagram of a controller 50.

As depicted in FIG. 10, the print apparatus 1 is provided with a first detection circuit 65(1) corresponding to a first actuator 88a and a second detection circuit 65(2) corresponding to a second actuator 88b. The first actuator 88a is provided with a first piezoelectric member 83a (see FIG. 3), and the second actuator 88b is provided with a second piezoelectric member 83b (see FIG. 3). That is, the detection circuit 65(1) corresponds to the first piezoelectric member 83a, and the second detection circuit 65(2) corresponds to the second piezoelectric member 83b. Each of the first detection circuit 65(1) and the second detection circuit 65(2) is provided with a clap type oscillation circuit 30. In the following description, the clap type oscillation circuit 30 of the first detection circuit 65(1) is referred to as "first oscillation circuit", and the clap type oscillation circuit 30 of the second detection circuit 65(2) is referred to as "second oscillation circuit".

The control circuit 64 connects (turns on) the first detecting switch 67a1, and the control circuit 64 allows the first detection circuit 65(1) to detect the capacitance of the first piezoelectric member 83a. The control circuit 64 connects (turns on) the second detecting switch 67a2, and the control circuit 64 allows the second detection circuit 65(2) to detect the capacitance of the second piezoelectric member 83b. The detection of the capacitances of the first piezoelectric member 83a by first oscillation circuit and the detection of the second piezoelectric member 83b by the second oscillation circuit are performed substantially simultaneously. In other words, as for the first oscillation circuit and the second oscillation circuit, the timings to detect the capacitances of the first piezoelectric member 83a and the second piezoelectric member 83b may be partially overlapped with each other. Alternatively, the start timings of the timings to detect the capacitances of the first piezoelectric member 83a and the second piezoelectric member 83b may be coincident with each other. Further, as for the first oscillation circuit and the second oscillation circuit, on condition that the start timings of the timings to detect the capacitances of the first piezoelectric member 83a and the second piezoelectric member 83b are coincident with each other, the cycles of the timings to detect the capacitances of the first piezoelectric member 83a and the second piezoelectric member 83b may be coincident with each other. Further, the end timings of the timings to detect the capacitances of the first piezoelectric member 83a and the second piezoelectric member 83b may be coincident with each other. Note that the respective capacitances of the first actuator 88a and the second actuator 88b are detected in the state in which the voltage is applied between the first common electrode 84 and the second common electrode 86 in the same manner as the first embodiment.

In the third embodiment, the first oscillation circuit and the second oscillation circuit detect the capacitances of the first piezoelectric member 83a and the second piezoelectric member 83b, respectively and simultaneously (that is, detection of the capacitance of the first piezoelectric member 83a by the first oscillation circuit and detection of the capacitance of the second piezoelectric member 83b by the second oscillation circuit are performed simultaneously). Therefore, it is possible to reduce the detection time for the capacitance, as compared with a case in which the capacitances of the respective piezoelectric members are successively detected.

Fourth Embodiment

Figure 11:
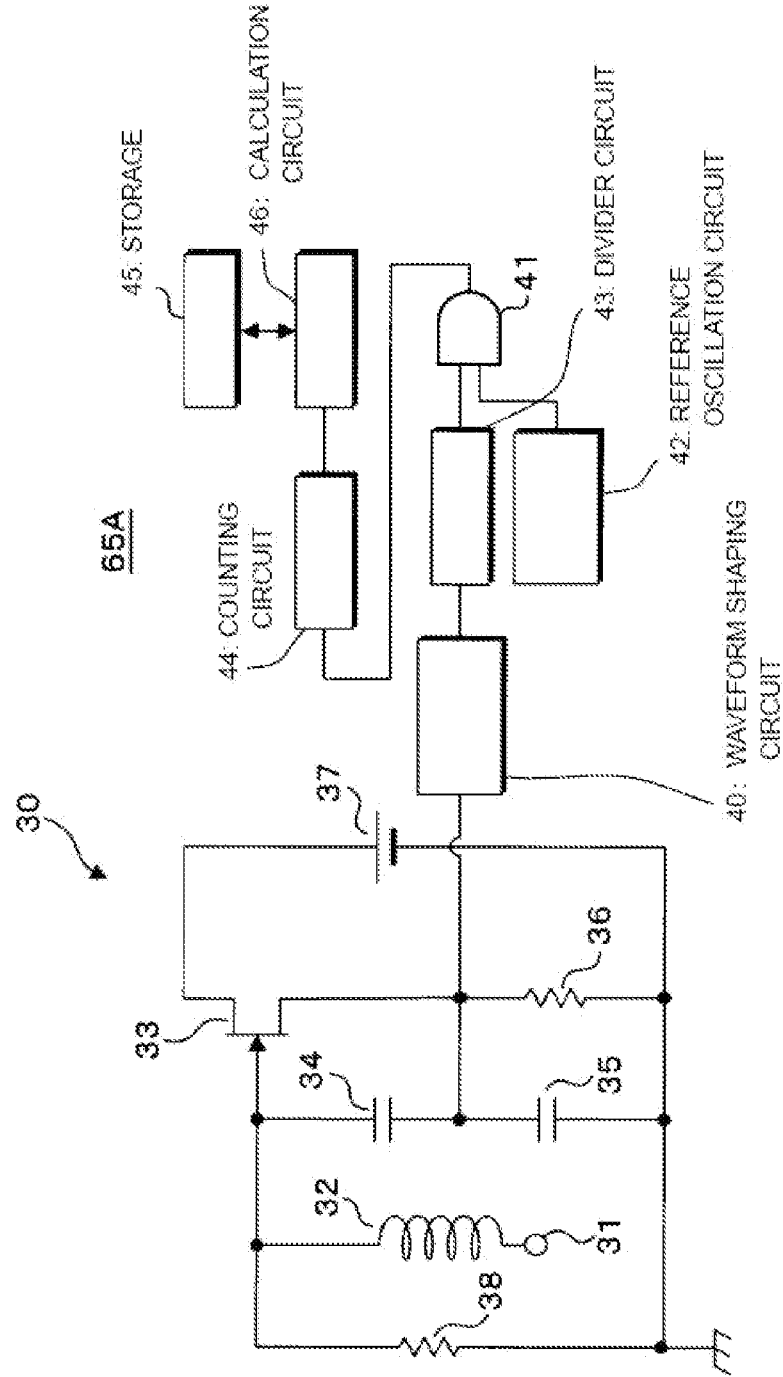
FIG. 11 is a circuit diagram of a detection circuit.

A printing apparatus 1 according to a fourth embodiment of the present disclosure will be explained below on the basis of the drawing. The components or parts concerning the fourth embodiment, which are the same as or equivalent to those of the first to third embodiments, are designated by the same reference numerals, any detailed explanation of which will be omitted. FIG. 11 is a circuit diagram of a detection circuit 65A. The detection circuit 65A is provided with a waveform shaping circuit 40, an AND gate 41, a reference oscillation circuit 42, a divider circuit 43, a counting circuit 44, a storage (storage unit) 45, and a calculating circuit 46. The waveform shaping circuit 40, the AND gate 41, the reference oscillation circuit 42, the divider circuit 43, the counting circuit 44, and the calculating circuit 46 constitute a frequency counter based on the reciprocal count system.

The waveform shaping circuit 40 shapes the inputted waveform signal, and the signal is outputted to the divider circuit 43. The divider circuit 43 divides the inputted waveform signal (performs frequency division for the inputted waveform signal), and the signal is outputted to the AND gate 41. The reference oscillation circuit 42 generates a clock signal which is outputted to the AND gate 41. The AND gate 41 outputs the pulse wave of the clock signal inputted from the reference oscillation circuit 42 during the period of one cycle of the divided waveform signal. The counting circuit 44 counts the pulse number of the inputted pulse wave, and the pulse number is outputted to the calculating circuit 46. The calculating circuit 46 calculates the reciprocal of the counted pulse number, i.e., the cycle of the divided waveform signal. The cycle is multiplied by the division ratio to calculate the cycle of the waveform signal. Then, the cycle of the waveform signal is multiplied by the frequency of the clock signal to derive the frequency F1 of the waveform signal from the clap type oscillation circuit 30 including the first capacitor 89a and the second capacitor 89b. For example, if the division ratio is 4, the frequency of the clock signal is 20 MHz, and the counted pulse number is 1000, then the frequency of 80 kHz is derived. Note that it is also allowable that the divider circuit 43 is not provided. If the divider circuit 43 is not provided, the calculating circuit 46 calculates the cycle of the waveform signal.

Figure 12:
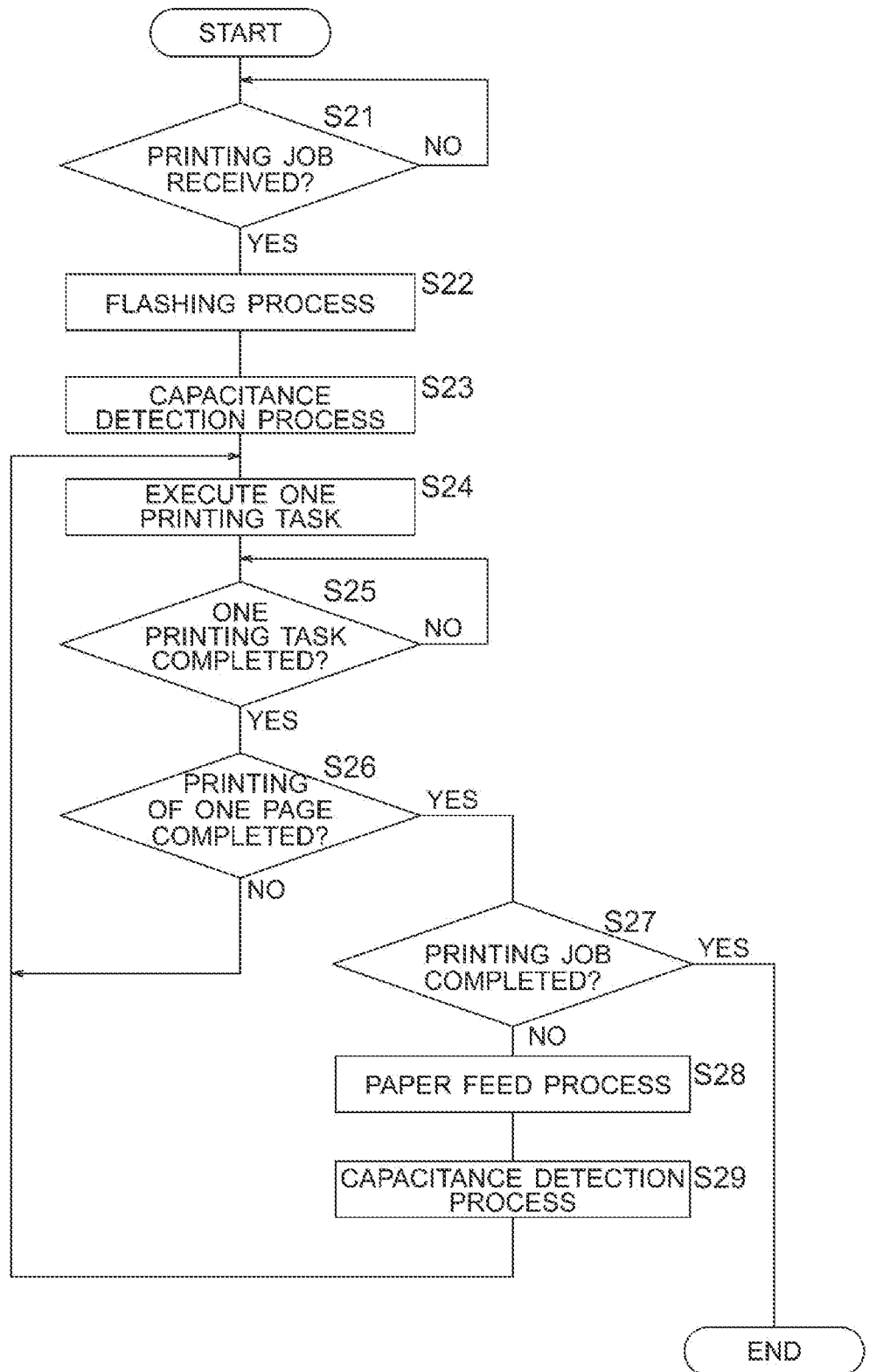
FIG. 12 is a flow chart illustrative of a printing process controlled by a controller.

FIG. 12 is a flow chart illustrative of a printing process controlled by the controller 50. Steps S21 to S25 shown in FIG. 12 are the same as or equivalent to Steps S1 to S5 (see FIG. 6) in the first embodiment, any detailed explanation of which will be omitted.

In Step S25, if one printing task is completed (S25: YES), the controller 50 determines whether or not the printing of one page is completed (S26). If the printing of one page is not completed (S26: NO), the controller 50 returns the process to Step S24. If the printing of one page is completed (S26: YES), the controller 50 determines whether or not the printing job is completed (S27). If the printing job is completed (S27: YES), the controller 50 terminates the printing process. If the printing job is not completed (S27: NO), the controller 50 performs the paper feed process (S28).

In this case, the recording paper 200 includes a first recording medium and a second recording medium. Each of the first recording medium and the second recording medium corresponds to one page. For example, if the printing on the first recording medium is completed, and the printing job is not completed, then the second recording medium is conveyed to the platen 2, while starting from the state in which only the conveying roller 5 conveys the first recording medium and passing through the state in which only the conveying roller 5 conveys the first recording medium and only the conveying roller 4 conveys the second recording medium in the paper feed process. That is, the first recording medium and the second recording medium are conveyed toward the nozzles 80. Note that when the second recording medium arrives at the platen 2, then the first recording medium is separated from the conveying roller 5, and the conveyance of the first recording medium is terminated.

After the start of the paper feed process, the controller 50 executes the capacitance detection process (S29) concurrently with the paper feed process, and the process is returned to S24. The controller 50 outputs a detection execution command to the control circuit 64. The control circuit 64 allows the detection circuit 65A to detect the capacitances of the first capacitor 89a and the second capacitor 89b. That is, the detection circuit 65A measures the cycle of the waveform signal outputted from the clap type oscillation circuit 30 to detect the capacitance before the start of the printing on the second recording medium after the termination of the printing on the first recording medium.

The time, which elapses during the period before the start of the printing on the second recording medium after the termination of the printing on the first recording medium, is shorter than the time which elapses between the printing tasks. The frequency counter based on the reciprocal count system can measure the frequency in a time shorter than that required for the frequency counter based on the direct count system. On this account, the detection circuit 65A measures the frequency before the start of the printing on the second recording medium after the termination of the printing on the first recording medium.

In the fourth embodiment, the frequency is measured before the start of the printing on the second recording medium after the termination of the printing on the first recording medium. Thus, it is possible to shorten the time required to measure the frequency.

Further, the frequency counter based on the reciprocal count system is used. Thus, it is possible to realize the measurement of the frequency in a short period of time.

Fifth Embodiment

Figure 13:
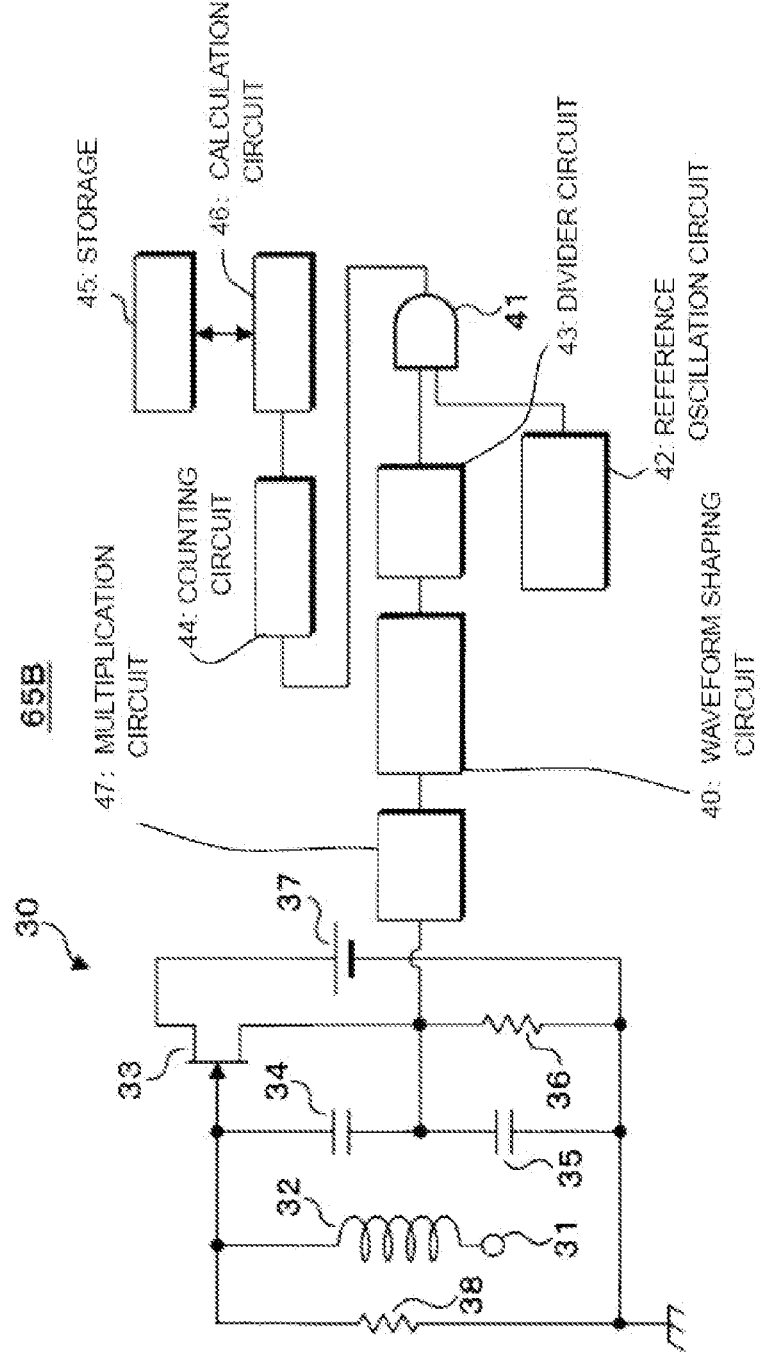
FIG. 13 is a circuit diagram of a detection circuit.

A print apparatus 1 according to a fifth embodiment of the present disclosure will be explained below on the basis of the drawing. The components or parts concerning the fifth embodiment, which are the same as or equivalent to those of the first to fourth embodiments, are designated by the same reference numerals, any detailed explanation of which will be omitted. FIG. 13 is a circuit diagram of a detection circuit 65B. The detection circuit 65B is provided with a waveform shaping circuit 40, an AND gate 41, a reference oscillation circuit 42, a divider circuit 43, a counting circuit 44, a storage (storage unit) 45, a calculating circuit 46, and a multiplication circuit 47. The waveform shaping circuit 40, the AND gate 41, the reference oscillation circuit 42, the divider circuit 43, the counting circuit 44, and the calculating circuit 46 constitute a frequency counter based on the multiplication circuit system.

The waveform signal, which is outputted from the clap type oscillation circuit 30, is inputted into the multiplication circuit 47. The multiplication circuit 47 increases the frequency of the waveform signal. For example, the multiplication circuit 47 increases the frequency by ten times, and the signal is outputted to the waveform shaping circuit 40. The waveform shaping circuit 40, the divider circuit 43, the AND gate 41, the reference oscillation circuit 42, the counting circuit 44, and the calculating circuit 46 calculate the cycle of the waveform signal, and the cycle is multiplied by the frequency of the clock signal, and the frequency F1 is derived for the waveform signal supplied from the clap type oscillation circuit 30 including the first capacitor 89a and the second capacitor 89b, in the same manner as in the reciprocal count system of the fourth embodiment. Note that the multiplication circuit 47 may be incorporated into the frequency counter based on the direct count system of the first embodiment to derive the frequency F1.

Figure 14:
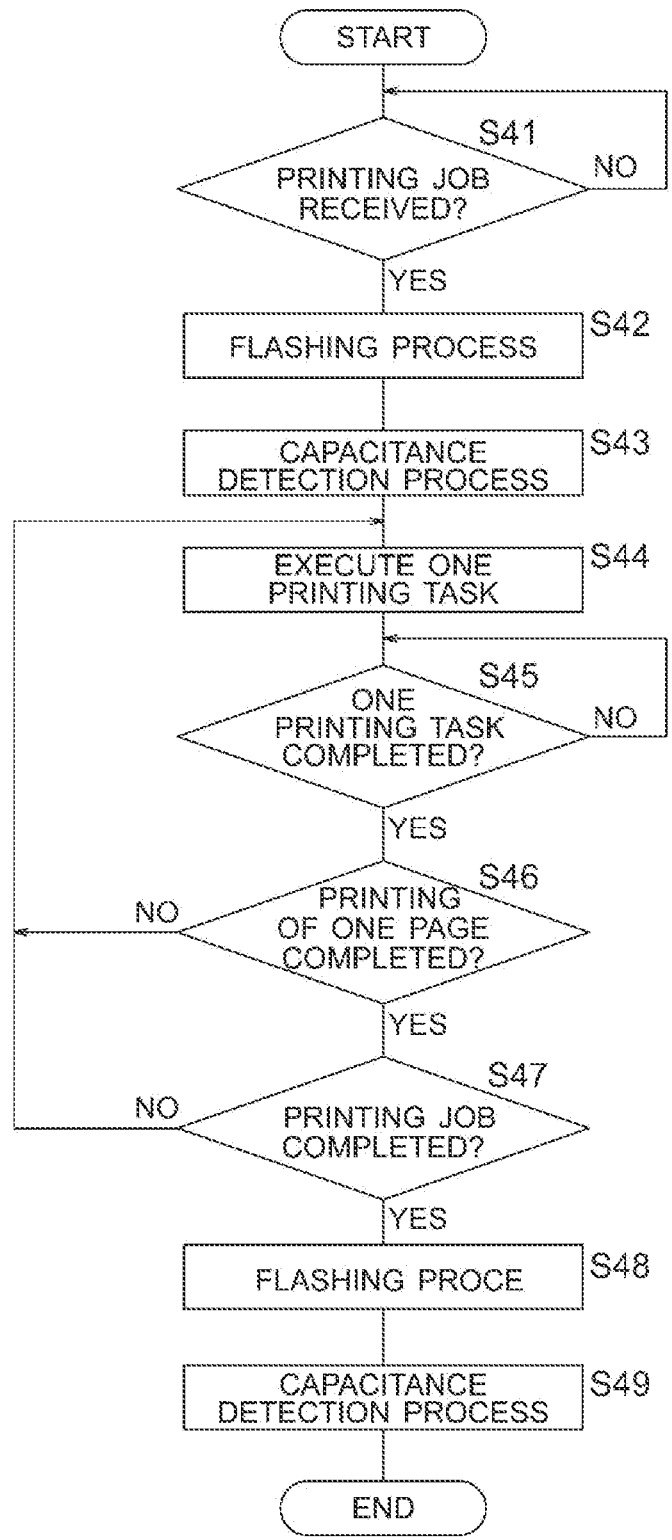
FIG. 14 is a flow chart illustrative of a printing process controlled by a controller.

FIG. 14 is a flow chart illustrative of a printing process controlled by the controller 50. Steps S41 to S46 shown in FIG. 14 are the same as or equivalent to Steps S21 to S26 (see FIG. 12) in the fourth embodiment, any detailed explanation of which will be omitted.

In Step S46, if the printing of one page is completed (S46: YES), the controller 50 determines whether or not the printing job is completed (S47). If the printing job is not completed (S47: NO), the controller 50 returns the process to Step S44. If the printing job is completed (S47: YES), i.e., if the process is in such a state that the printing job is not stored in the storage 50a, then the controller 50 executes the flashing process (S48), the controller 50 executes the capacitance detection process (S49), and the printing process is terminated. That is, the controller 50 concurrently executes the flashing process and the capacitance detection process, and the printing process is terminated.

In the fifth embodiment, the controller 50 executes the capacitance detection process after all of the printing based on the printing job is completed. When the multiplication circuit 47 is incorporated into the frequency counter based on the direct count system to derive the frequency F1, a long time may be required to derive the frequency. On this account, the printing can be smoothly executed by executing the capacitance detection process after completing all of the printing based on the printing job.

Further, the controller 50 concurrently executes the flashing process and the capacitance detection process after completing all of the printing based on the printing job. The time, which is required for the flashing process, is longer than the time between the printing tasks. It is possible to preferably perform the capacitance detection process by means of the detection circuit 65B by executing the capacitance detection process during the execution of the flashing process. Further, concurrent execution makes it possible to reduce the time required for the entire printing process.

Note that when the suction process from the nozzles 80 is executed, the suction process requires a time which is equivalent to the time required for the flashing process or a time which is not less than the time required for the flashing process. On this account, the capacitance detection process may be executed during the suction process. The flashing process and the suction process are included in the maintenance process.

Sixth Embodiment

Figure 15:
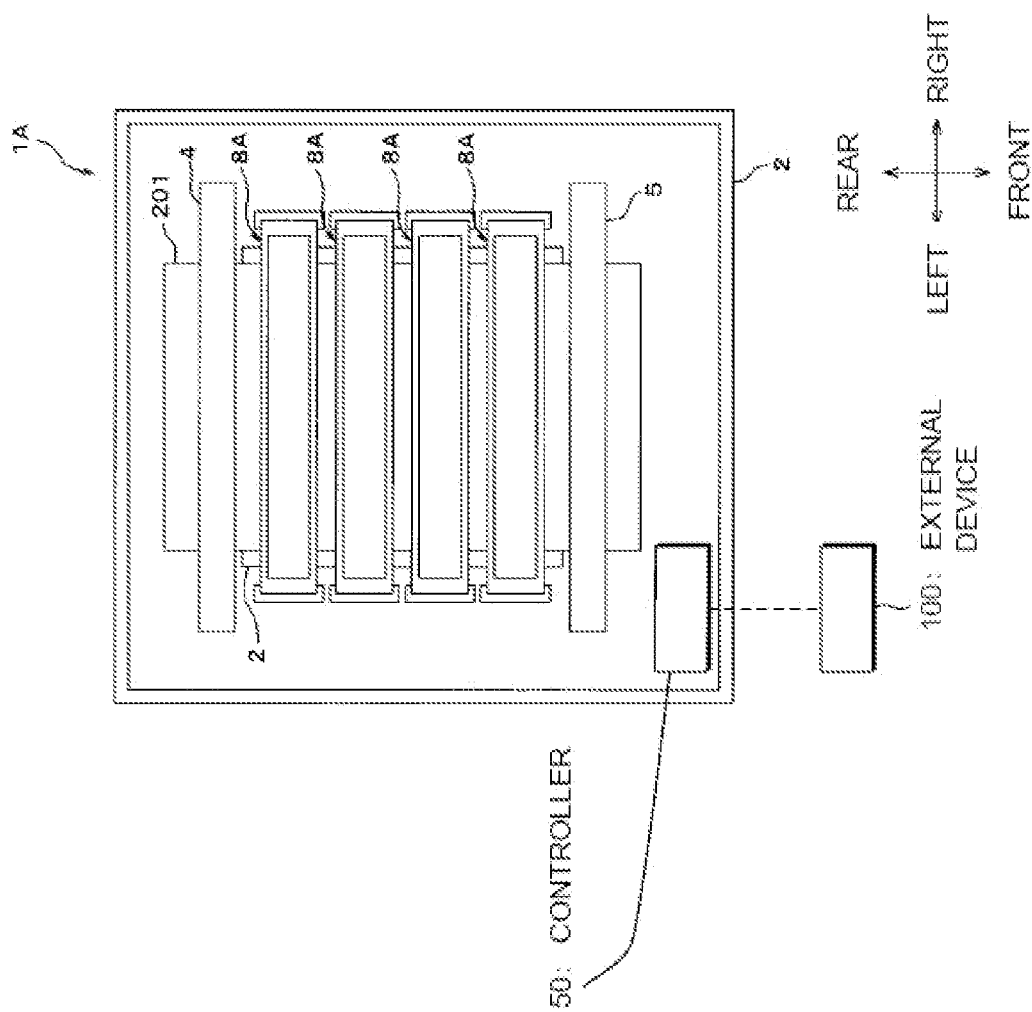
FIG. 15 is a plan view schematically illustrative of a print apparatus.

A print apparatus 1A according to a sixth embodiment of the present disclosure will be explained below on the basis of the drawing. The components or parts concerning the sixth embodiment, which are the same as or equivalent to those of the first to fifth embodiments, are designated by the same reference numerals, any detailed explanation of which will be omitted. FIG. 15 is a plan view schematically illustrative of the print apparatus 1A. As depicted in FIG. 15, the print apparatus 1A is provided with, for example, a platen 2, four ink-jet heads 8A, two conveying rollers 4, 5, and a controller 50. The print apparatus 1A is a print apparatus based on the line head system. The ink jet heads 8A are fixed at predetermined positions.

A label 201 is placed on the upper surface of the platen 2. The label 201 includes a first label and a second label. The four ink-jet heads 8A are aligned in the conveying direction (front-rear direction) over or above the platen 2. Each of the ink-jet heads 8A is a so-called line type head. For example, each of the ink-jet heads 8A has a plurality of ink-jet heads 8 of the first embodiment. The ink-jet heads 8 of the first embodiment are arranged in a zigzag form. Inks are supplied from ink tanks to the ink-jet heads 8A. The inks of different colors are supplied to the four ink jet heads 8A.

As depicted in FIG. 15, the two conveying rollers 4, 5 are arranged on the rear side and the front side with respect to the platen 2 respectively. Each of the two conveying rollers 4, 5 is driven by an unillustrated motor so that the label 201 on the platen 2 is conveyed frontwardly. For example, the first label is conveyed, and then the second label is conveyed. The controller 50 controls the respective parts or components of the print apparatus 1A on the basis of the printing data fed from the external device 100. The print apparatus 1A is provided with a detection circuit 65 (see FIG. 5).

Figure 16:
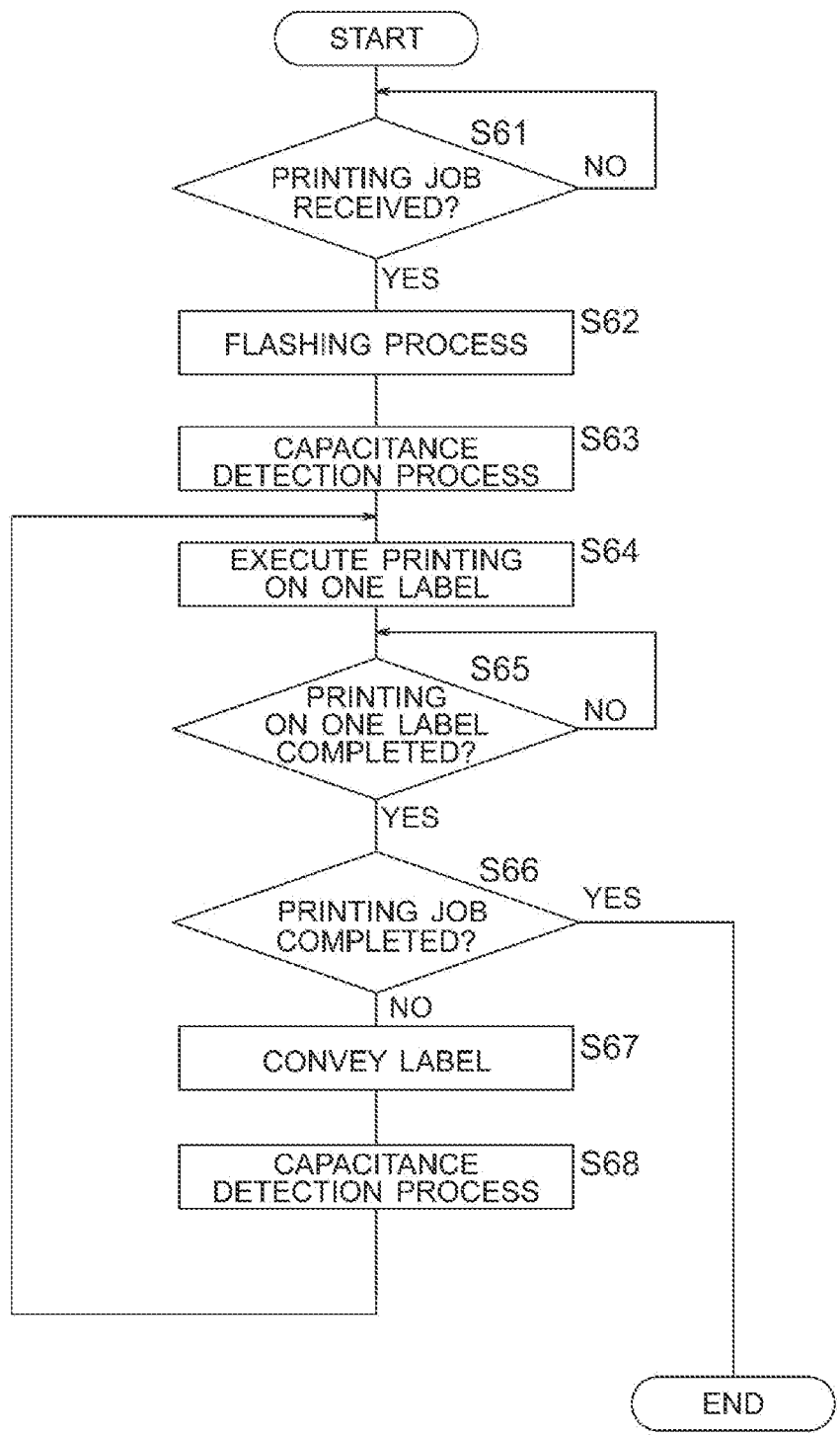
FIG. 16 is a flow chart illustrative of a printing process controlled by a controller.

FIG. 16 is a flow chart illustrative of a printing process controlled by the controller 50. With reference to FIG. 16, Steps S61 to S63 are the same as or equivalent to Steps S1 to S3 in the first embodiment (see FIG. 6), any detailed explanation of which will be omitted.

The controller 50 executes the printing on one label (S64) after the execution of the capacitance detection process (S63). The controller 50 determines whether or not the printing on one label is completed (S65). If the printing on one label is not completed (S65: NO), the controller 50 returns the process to Step S65. If the printing on one label is completed (S65: YES), the controller 50 determines whether or not the printing job is completed (S66). If the printing job is completed (S66: YES), the controller 50 terminates the printing process.

If the printing job is not completed (S66: NO), then the controller 50 conveys the label (S67), the controller 50 executes the capacitance detection process (S68), and the controller 50 returns the process to Step S64. That is, the controller 50 allows, before the start of the printing on the second label after the termination of the printing on the first label, the detection circuit 65 to measures the cycle of the waveform signal outputted from the clap type oscillation circuit 30, and detect the capacitance.

In the sixth embodiment, the detection circuit 65 measures the frequency during the period before the start of the printing on the second label after the termination of the printing on the first label. When the frequency F1 is derived by using the frequency counter based on the direct count system, a long time may be required to derive the frequency in some cases. The time, which is provided during the period before the start of the printing on the second label after the termination of the printing on the first label, is equivalent to the time between the printing tasks or longer than the same. Therefore, it is possible to preferably perform the derivation of the frequency F1 based on the direct count system.

It should be understood that the embodiments disclosed herein are exemplified by way of example in relation to all of the viewpoints, and the embodiments are not restrictive. The technical features described in the respective embodiments can be combined with each other. It is intended that the scope of the present invention includes all changes or alterations included in claims and equivalent ranges equivalent to claims.

What is claimed is:

1. A print apparatus comprising:
   a piezoelectric member configured to be deformed in order to discharge a liquid from a nozzle;
   an individual electrode formed in the piezoelectric member;
   a first common electrode formed in the piezoelectric member;
   a second common electrode formed in the piezoelectric member, a voltage to be applied to the second common electrode being different from a voltage to be applied to the first common electrode; and
   a detection circuit configured to detect a capacitance of a first capacitor configured by the piezoelectric member, the individual electrode, and the first common electrode and a second capacitor configured by the piezoelectric member, the individual electrode, and the second common electrode,
   wherein the detection circuit includes an oscillation circuit configured to be connected to the individual electrode.

2. The print apparatus according to claim 1, further comprising a switching circuit configured to switch connection and disconnection between the individual electrode and the oscillation circuit,
   wherein, in a case that detection of the capacitance of the first capacitor and the second capacitor is executed, the switching circuit is configured to connect the oscillation circuit to the individual electrode in a state in which a voltage is applied between the first common electrode and the second common electrode.

3. The print apparatus according to claim 2, wherein:
   the nozzle includes a first nozzle and a second nozzle;
   the piezoelectric member includes a first piezoelectric member corresponding to the first nozzle and a second piezoelectric member corresponding to the second nozzle;
   the individual electrode includes a first individual electrode formed in the first piezoelectric member, and a second individual electrode formed in the second piezoelectric member;
   the first capacitor includes the first capacitor in the first piezoelectric member configured by the first piezoelectric member, the first individual electrode, and the first common electrode and the first capacitor in the second piezoelectric member configured by the second piezoelectric member, the second individual electrode, and the first common electrode;

the second capacitor includes the second capacitor in the first piezoelectric member configured by the first piezoelectric member, the first individual electrode, and the second common electrode and the second capacitor in the second piezoelectric member configured by the second piezoelectric member, the second individual electrode, and the second common electrode; and in a case that detection of the capacitance of the first capacitor in the first piezoelectric member and the second capacitor in the first piezoelectric member is terminated, and detection of the capacitance of the first capacitor in the second piezoelectric member and the second capacitor in the second piezoelectric member is started, a part of time when the oscillation circuit is connected to the first individual electrode overlaps with a part of time when the oscillation circuit is connected to the second individual electrode.

4. The print apparatus according to claim 2, wherein:

the nozzle includes a first nozzle and a second nozzle;

the piezoelectric member includes a first piezoelectric member corresponding to the first nozzle and a second piezoelectric member corresponding to the second nozzle;

the individual electrode includes a first individual electrode formed in the first piezoelectric member, and a second individual electrode formed in the second piezoelectric member;

the oscillation circuit includes a first oscillation circuit configured to be connected to the first individual electrode and a second oscillation circuit configured to be connected to the second individual electrode;

the first capacitor includes the first capacitor in the first piezoelectric member configured by the first piezoelectric member, the first individual electrode, and the first common electrode and the first capacitor in the second piezoelectric member configured by the second piezoelectric member, the second individual electrode, and the first common electrode;

the second capacitor includes the second capacitor in the first piezoelectric member configured by the first piezoelectric member, the first individual electrode, and the second common electrode and the second capacitor in the second piezoelectric member configured by the second piezoelectric member, the second individual electrode, and the second common electrode; and detection of the capacitance of the first capacitor in the first piezoelectric member and the second capacitor in the first piezoelectric member by the first oscillation circuit and detection of the capacitance of the first capacitor in the second piezoelectric member and the second capacitor in the second piezoelectric member by the second oscillation circuit are performed simultaneously.

5. The print apparatus according to claim 1, wherein:

the detection circuit includes a measuring circuit configured to measure a frequency outputted from the oscillation circuit; and the measuring circuit is configured to measure the frequency every time when a printing process is completed a predetermined number of times.

6. The print apparatus according to claim 5, wherein the measuring circuit is configured to measure the frequency outputted from the oscillation circuit by a frequency counter based on a direct count system.

7. The print apparatus according to claim 5, comprising:

a head including the piezoelectric member, the individual electrode, the first common electrode, the second common electrode, and the detection circuit; and a carriage which supports the head and which is configured to perform first movement for moving the head from a first position to a second position in a moving direction and second movement for moving the head from the second position to the first position in the moving direction, wherein:

in a case that printing process is performed during the first movement or the second movement, the measuring circuit is configured to measure the frequency every time when the carriage performs one moving or two movings in the printing process.

8. The print apparatus according to claim 5, wherein in a case that a first label and a second label are subjected to printing in accordance with a line head system, the measuring circuit is configured to measure the frequency before start of the printing on the second label after the printing on the first label in the printing process.

9. The print apparatus according to claim 5, wherein the detection circuit is configured to detect the capacitance of the first capacitor and the second capacitor before or after a flashing process for discharging the liquid from the nozzle.

10. The print apparatus according to claim 1, further comprising:

a conveyer configured to convey a first recording medium and a second recording medium, wherein:

the detection circuit includes a measuring circuit configured to measure a cycle of a signal outputted from the oscillation circuit; and the measuring circuit is configured to measure the cycle of the signal outputted from the oscillation circuit before start of printing on the second recording medium after printing on the first recording medium.

11. The print apparatus according to claim 10, wherein the measuring circuit is configured to measure the cycle of the signal outputted from the oscillation circuit by a frequency counter based on a reciprocal count system.

12. The print apparatus according to claim 1, further comprising a storage, wherein:

the printing apparatus is configured to store a printing job in the storage;

the detection circuit includes a measuring circuit configured to measure a frequency outputted from the oscillation circuit by a frequency counter based on a multiplication circuit system; and the measuring circuit is configured to measure the frequency after completing all of the printing based on the printing job stored in the storage.

13. The print apparatus according to claim 12, wherein the measuring circuit is configured to measure the frequency during execution of a maintenance process after the completing of all of the printing based on the printing job.

14. A head comprising:

a piezoelectric member configured to be deformed in order to discharge a liquid from a nozzle;

an individual electrode formed in the piezoelectric member;

a first common electrode formed in the piezoelectric member;

a second common electrode formed in the piezoelectric member, a voltage to be applied to the second common electrode being different from a voltage to be applied to the first common electrode; and a detection circuit configured to detect a capacitance of a first capacitor configured by the piezoelectric member, the individual electrode, and the first common electrode and a second capacitor configured by the piezoelectric member, the individual electrode, and the second common electrode, wherein:

the detection circuit includes an oscillation circuit configured to be connected to the individual electrode.

\* \* \* \* \*